United States Patent
Lee et al.

(10) Patent No.: US 11,703,753 B2
(45) Date of Patent: *Jul. 18, 2023

(54) PELLICLES FOR PHOTOMASKS, RETICLES INCLUDING THE PHOTOMASKS, AND METHODS OF MANUFACTURING THE PELLICLES

(71) Applicant: Samsung Electronics Co., Ltd., Suwon-si (KR)

(72) Inventors: Minhyun Lee, Yongin-si (KR); Hyeonjin Shin, Suwon-si (KR); Seongjun Jeong, Hwaseong-si (KR); Seongjun Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 199 days.

This patent is subject to a terminal disclaimer.

(21) Appl. No.: 17/223,568

(22) Filed: Apr. 6, 2021

(65) Prior Publication Data

US 2021/0223683 A1 Jul. 22, 2021

Related U.S. Application Data

(63) Continuation of application No. 16/004,585, filed on Jun. 11, 2018, now Pat. No. 10,996,556.

(30) Foreign Application Priority Data

Jul. 31, 2017 (KR) .......................... 10-2017-0097125
Jun. 8, 2018 (KR) .......................... 10-2018-0065906

(51) Int. Cl.
*G03F 1/62* (2012.01)
*G03F 1/64* (2012.01)

(52) U.S. Cl.
CPC . *G03F 1/62* (2013.01); *G03F 1/64* (2013.01)

(58) Field of Classification Search
CPC ..................................... G03F 1/62; G03F 1/64
See application file for complete search history.

(56) References Cited

U.S. PATENT DOCUMENTS 9,360,749 B2 6/2016 Lin et al.
10,539,868 B2 1/2020 Shin et al.
(Continued)

FOREIGN PATENT DOCUMENTS

EP 3151064 A2 4/2017
JP 2016-515091 A 5/2016
(Continued)

OTHER PUBLICATIONS

Extended European Search Report dated Dec. 19, 2018 for corresponding European Application No. 18183212.2.
(Continued)

*Primary Examiner* — Daborah Chacko-Davis
(74) *Attorney, Agent, or Firm* — Harness, Dickey & Pierce, P.L.C.

(57) ABSTRACT

A pellicle configured to protecting a photomask from external contaminants may include a metal catalyst layer and a pellicle membrane including a 2D material on the metal catalyst layer, wherein the metal catalyst layer supports edge regions of the pellicle membrane and does not support a central region of the pellicle membrane. The metal catalyst layer may be on a substrate, such that the substrate and the metal catalyst layer collectively support the edge region of the pellicle membrane and do not support the central region of the pellicle membrane. The pellicle may be formed based on growing the 2D material on the metal catalyst layer and etching an inner region of the metal catalyst layer that supports the central region of the formed pellicle membrane.

31 Claims, 8 Drawing Sheets

(56) References Cited

U.S. PATENT DOCUMENTS

| | | |
|---|---|---|
| 10,551,735 B2 | 2/2020 | Jeong et al. |
| 10,684,560 B2 | 6/2020 | Shin et al. |
| 10,996,556 B2* | 5/2021 | Lee .......................... G03F 1/62 |
| 2013/0250260 A1 | 9/2013 | Singh |
| 2014/0160455 A1 | 6/2014 | Yakunin et al. |
| 2015/0309404 A1 | 10/2015 | Lin et al. |
| 2015/0309405 A1 | 10/2015 | Shih et al. |
| 2016/0109798 A1 | 4/2016 | Shih et al. |
| 2016/0139501 A1 | 5/2016 | Kim et al. |
| 2016/0147137 A1 | 5/2016 | Shih et al. |
| 2016/0147141 A1 | 5/2016 | Ono et al. |
| 2016/0201201 A1 | 7/2016 | Kim et al. |
| 2016/0282712 A1 | 9/2016 | Kim et al. |
| 2016/0334698 A1 | 11/2016 | Jeon et al. |
| 2016/0363857 A1 | 12/2016 | Shih et al. |
| 2017/0017150 A1 | 1/2017 | Yakunin et al. |
| 2017/0038675 A1 | 2/2017 | Ahn et al. |
| 2017/0075212 A1 | 3/2017 | Goldfarb |
| 2017/0090278 A1 | 3/2017 | Chiu et al. |

FOREIGN PATENT DOCUMENTS

| | | |
|---|---|---|
| KR | 2017-0067662 A | 6/2017 |
| WO | WO-2014/151226 A1 | 9/2014 |
| WO | WO-2017/067813 A2 | 4/2017 |

OTHER PUBLICATIONS

Office Action for corresponding Japanese Patent Application No. 2018-139246 dated Jun. 6, 2022 and English translation thereof.

\* cited by examiner

PELLICLES FOR PHOTOMASKS, RETICLES INCLUDING THE PHOTOMASKS, AND METHODS OF MANUFACTURING THE PELLICLES

CROSS-REFERENCE TO RELATED APPLICATION

This application is a continuation of U.S. application Ser. No. 16/004,585, filed Jun. 11, 2018, which claims the benefit, under 35 U.S.C. § 119, of Korean Patent Application Nos. 10-2017-0097125, filed on Jul. 31, 2017 and 10-2018-0065906, filed on Jun. 8, 2018, in the Korean Intellectual Property Office, the disclosure of each of which is incorporated herein in its entirety by reference.

BACKGROUND

1. Field

The present disclosure relates to pellicles for photomasks, reticles including the photomasks, and methods of manufacturing the pellicles for photomasks.

2. Description of the Related Art

A pellicle may be provided on a photomask to protect the photomask from external contaminants (for example, dust, resists, etc.) in an optical lithography process. The pellicle should have a high transmittance with respect to light used in the lithography process and also satisfy various conditions such as heat dissipation characteristics, strength, uniformity, durability, stability, etc. As a line-width of semiconductor devices/electronic circuits is reduced, wavelength of light used in the lithography process may be reduced to match the reduced line-width.

SUMMARY

Some example embodiments include a pellicle material suitable for a light source used in the optical lithography process.

Some example embodiments include pellicles configured to protect photomasks from external contaminants, reticles including the photomasks, and methods of manufacturing the pellicles for photomasks.

Additional aspects will be set forth in part in the description which follows and, in part, will be apparent from the description, or may be learned by practice of the presented embodiments.

According to some example embodiments, a pellicle configured to protect a photomask may include a substrate, a metal catalyst layer on the substrate, and a pellicle membrane on the metal catalyst layer. The pellicle membrane may include a two-dimensional (2D) material. The pellicle membrane may have a central region and an edge region, the edge region at least partially surrounding the central region. The substrate and the metal catalyst layer may collectively support the edge region of the pellicle membrane and may not support the central region of the pellicle membrane.

The metal catalyst layer may have a thickness in a range from about 10 nm to about 100 μm.

The metal catalyst layer may have a thickness in a range from about 10 nm to about 10 μm.

The pellicle may further include a barrier layer between the substrate and the metal catalyst layer.

The barrier layer may include at least one of $SiO_2$, $Si_3N_4$, TiN, and TaN.

The 2D material may include at least one of h-BN, Si, P, B, and graphene.

The pellicle membrane may have a thickness in a range from about 5 nm to about 50 nm.

The metal catalyst layer may include at least one of Pt, Cu, Ni, Co, Ag, W, Mo, Pd, and Ru.

The pellicle membrane may have an optical transmittance of greater than or equal to about 80%.

A sum of a height of the metal catalyst layer and a height of the substrate may be in a range from 1 mm to 10 mm.

The pellicle for a photomask may further include a protection film on at least one surface of the pellicle membrane.

The protection film may include at least one of a carbon-based material, a transition metal dichalcogenide (TMD), Ru, Mo, Si, Zr, B, and SiN.

According to some example embodiments, a method of manufacturing a pellicle configured to protect a photomask may include forming a metal catalyst layer on a substrate, forming a pellicle membrane on the metal catalyst layer, and etching inner regions of the substrate and the metal catalyst layer that support the central region of the pellicle membrane, such that the substrate and the metal catalyst layer collectively support the edge region of the pellicle membrane and do not support the central region of the pellicle membrane. The pellicle membrane may include a two-dimensional (2D) material. The pellicle membrane may include a central region and an edge region, the edge region at least partially surrounding the central region.

The method may further include forming a barrier layer on the substrate.

The method may further include forming a protection film on at least one surface of the pellicle membrane.

The forming of the pellicle membrane may include forming the pellicle membrane directly on a surface of the metal catalyst layer.

The etching may include etching the substrate and the metal catalyst layer based on using at least one of a mechanical etching method, a dry etching method, and a wet etching method.

According to some example embodiments, a method of manufacturing a pellicle configured to protect a photomask may include forming a barrier layer on a substrate, forming a metal catalyst layer on the barrier layer, forming a pellicle membrane between the metal catalyst layer and the barrier layer, removing the metal catalyst layer, and etching inner regions of the substrate and the barrier layer that support the central region of the pellicle membrane, such that the substrate and the barrier layer collectively support the edge region of the pellicle membrane and do not support the central region of the pellicle membrane. The pellicle membrane may include a two-dimensional (2D) material. The pellicle membrane may have a central region and an edge region, the edge region at least partially surrounding the central region.

The method may further include forming a protection film on at least one surface of the pellicle membrane.

Each of the removing of the metal catalyst layer and the etching of the substrate and the barrier layer may be performed based on using at least one of a mechanical etching method, a dry etching method, and a wet etching method.

According to some example embodiments, a reticle may include a photomask and a pellicle. The photomask may include a mask pattern. The pellicle may include a substrate, a metal catalyst layer on the substrate and surrounding the mask pattern, and a pellicle membrane including a two-dimensional (2D) material. The pellicle membrane may include a central region and an edge region. The edge region may at least partially surround the central region. The edge region may be supported by the substrate and the metal catalyst layer, and the central region may be unsupported by the substrate and the metal catalyst layer.

The photomask may be spaced apart from the pellicle membrane by a distance in a range from about 1 mm to about 10 mm.

The metal catalyst layer may have a thickness in a range from about 10 nm to about 100 µm.

The metal catalyst layer may have a thickness in a range from about 10 nm to about 10 µm.

The pellicle may further include a barrier layer between the substrate and the metal catalyst layer.

The barrier layer may include at least one of $SiO_2$, $Si_3N_4$, TiN, and TaN.

The 2D material may include at least one of h-BN, Si, P, B, and graphene.

The pellicle membrane may have a thickness in a range from about 5 nm to about 50 nm.

The metal catalyst layer may include at least one of Pt, Cu, Ni, Co, Ag, W, Mo, Pd, and Ru.

The pellicle membrane may have an optical transmittance greater than or equal to about 80%.

The pellicle may further include a protection film on at least one surface of the pellicle membrane.

The protection film may include at least one of a carbon-based material, a transition metal dichalcogenide (TMD), Ru, Mo, Si, Zr, B, and SiN.

According to some example embodiments, a pellicle configured to protect a photomask may include a metal catalyst layer and a pellicle membrane on the metal catalyst layer. The pellicle membrane may include a two-dimensional (2D) material. The pellicle membrane may have a central region and an edge region. The edge region may at least partially surround the central region. The metal catalyst layer may support the edge region of the pellicle membrane and may not support the central region of the pellicle membrane.

The pellicle may further include a substrate, where the metal catalyst layer is on the substrate, and where the substrate and the metal catalyst layer collectively support the edge region of the pellicle membrane and do not support the central region of the pellicle membrane.

The pellicle may further include a barrier layer between the substrate and the metal catalyst layer.

The barrier layer may include at least one of $SiO_2$, $Si_3N_4$, TiN, and TaN.

A sum of a height of the metal catalyst layer and a height of the substrate may be in a range from about 1 mm to about 10 mm.

The metal catalyst layer may have a thickness in a range from about 10 nm to about 100 µm.

The metal catalyst layer may have a thickness in a range from about 10 nm to about 10 µm.

The 2D material may include at least one of h-BN, Si, P, B, and graphene.

The pellicle membrane may have a thickness in a range from about 5 nm to about 50 nm.

The metal catalyst layer may include at least one of Pt, Cu, Ni, Co, Ag, W, Mo, Pd, and Ru.

The pellicle membrane may have an optical transmittance greater than or equal to about 80%.

The pellicle may further include a protection film on at least one surface of the pellicle membrane.

The protection film may include at least one of a carbon-based material, a transition metal dichalcogenide (TMD), Ru, Mo, Si, Zr, B, and SiN.

According to some example embodiments, a method of manufacturing a pellicle configured to protect a photomask may include forming a pellicle membrane on a metal catalyst layer. The pellicle membrane may include a two-dimensional (2D) material. The pellicle membrane may include a central region and an edge region. The edge region may at least partially surround the central region. The method may further include etching at least an inner region of the metal catalyst layer that supports the central region of the pellicle membrane, such that the metal catalyst layer supports the edge region of the pellicle membrane and does not support the central region of the pellicle membrane.

The method may further include forming the metal catalyst layer on a substrate, wherein the etching etches inner regions of the substrate and the metal catalyst layer that support the central region of the pellicle membrane, such that the substrate and the metal catalyst layer collectively support the edge region of the pellicle membrane and do not support the central region of the pellicle membrane.

The method may further include forming a barrier layer on the substrate.

The method may further include forming a protection film on at least one surface of the pellicle membrane.

The forming of the pellicle membrane may include forming the pellicle membrane directly on a surface of the metal catalyst layer.

The etching of the metal catalyst layer may include etching the metal catalyst layer based on using at least one of a mechanical etching method, a dry etching method, and a wet etching method.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
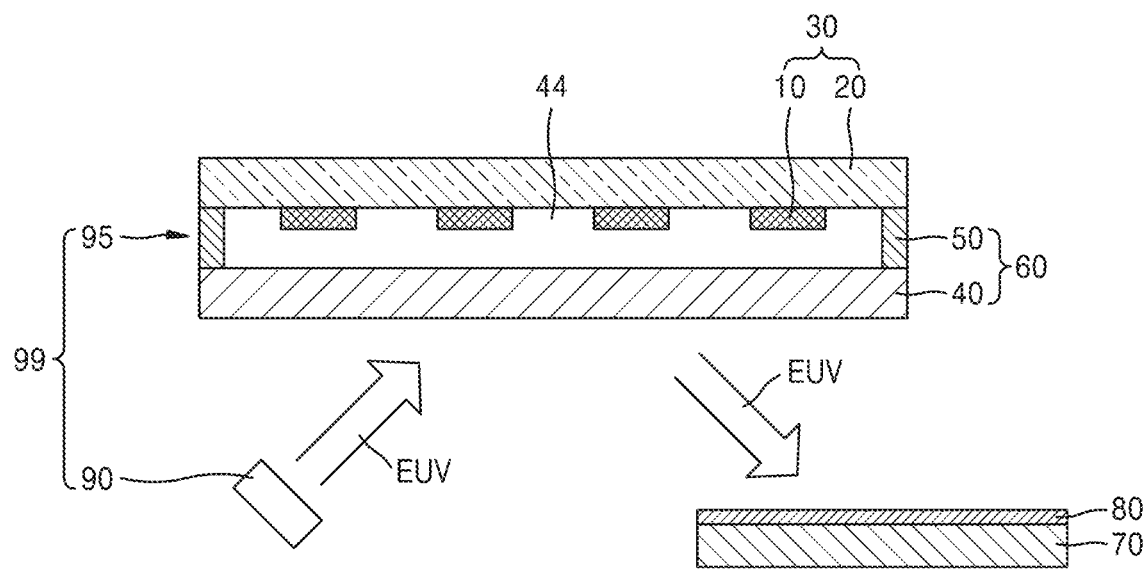
FIG. 1 is a schematic cross-sectional view of an exposure apparatus according to some example embodiments of the inventive concepts.

Reference will now be made in detail to embodiments, examples of which are illustrated in the accompanying drawings so that those of ordinary skill in the art may readily understand. Also, it should be understood that the embodiments may be realized in various ways, and thus, the inventive concepts are not limited to the embodiments described above. In the drawings, portions irrelevant to the description are omitted for convenience of explanation, and like reference numerals are used to indicate elements that are similar to each other throughout the specification.

It should be understood that, when the specification describes that a part "comprises" or "includes" an element, unless otherwise defined, other elements are not excluded from the part and the part may further include other elements.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

Example embodiments may be described with reference to acts and symbolic representations of operations (e.g., in the form of flow charts, flow diagrams, data flow diagrams, structure diagrams, block diagrams, etc.) that may be implemented in conjunction with units and/or devices discussed in more detail below. Although discussed in a particularly manner, a function or operation specified in a specific block may be performed differently from the flow specified in a flowchart, flow diagram, etc. For example, functions or operations illustrated as being performed serially in two consecutive blocks may actually be performed simultaneously, or in some cases be performed in reverse order.

Units and/or devices according to one or more example embodiments may be implemented using hardware, software, and/or a combination thereof. For example, hardware devices may be implemented using processing circuitry such as, but not limited to, a processor, Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, or any other device capable of responding to and executing instructions in a defined manner.

Software may include a computer program, program code, instructions, or some combination thereof, for independently or collectively instructing or configuring a hardware device to operate as desired. The computer program and/or program code may include program or computer-readable instructions, software components, software modules, data files, data structures, and/or the like, capable of being implemented by one or more hardware devices, such as one or more of the hardware devices mentioned above. Examples of program code include both machine code produced by a compiler and higher level program code that is executed using an interpreter.

For example, when a hardware device is a computer processing device (e.g., a processor, Central Processing Unit (CPU), a controller, an arithmetic logic unit (ALU), a digital signal processor, a microcomputer, a microprocessor, etc.), the computer processing device may be configured to carry out program code by performing arithmetical, logical, and input/output operations, according to the program code. Once the program code is loaded into a computer processing device, the computer processing device may be programmed to perform the program code, thereby transforming the computer processing device into a special purpose computer processing device. In a more specific example, when the program code is loaded into a processor, the processor becomes programmed to perform the program code and operations corresponding thereto, thereby transforming the processor into a special purpose processor.

Software and/or data may be embodied permanently or temporarily in any type of machine, component, physical or virtual equipment, or computer storage medium or device, capable of providing instructions or data to, or being interpreted by, a hardware device. The software also may be distributed over network coupled computer systems so that the software is stored and executed in a distributed fashion. In particular, for example, software and data may be stored by one or more computer readable recording mediums, including the tangible or non-transitory computer-readable storage media discussed herein.

According to one or more example embodiments, computer processing devices may be described as including various functional units that perform various operations and/or functions to increase the clarity of the description. However, computer processing devices are not intended to be limited to these functional units. For example, in one or more example embodiments, the various operations and/or functions of the functional units may be performed by other ones of the functional units. Further, the computer processing devices may perform the operations and/or functions of the various functional units without sub-dividing the operations and/or functions of the computer processing units into these various functional units.

Units and/or devices according to one or more example embodiments may also include one or more storage devices. The one or more storage devices may be tangible or non-transitory computer-readable storage media, such as random access memory (RAM), read only memory (ROM), a permanent mass storage device (such as a disk drive), solid state (e.g., NAND flash) device, and/or any other like data storage mechanism capable of storing and recording data. The one or more storage devices may be configured to store computer programs, program code, instructions, or some combination thereof, for one or more operating systems and/or for implementing the example embodiments described herein. The computer programs, program code, instructions, or some combination thereof, may also be loaded from a separate computer readable storage medium into the one or more storage devices and/or one or more computer processing devices using a drive mechanism. Such separate computer readable storage medium may include a Universal Serial Bus (USB) flash drive, a memory stick, a Blu-ray/DVD/CD-ROM drive, a memory card, and/or other like computer readable storage media. The computer programs, program code, instructions, or some combination thereof, may be loaded into the one or more storage devices and/or the one or more computer processing devices from a remote data storage device via a network interface, rather than via a local computer readable storage medium. Additionally, the computer programs, program code, instructions, or some combination thereof, may be loaded into the one or more storage devices and/or the one or more processors from a remote computing system that is configured to transfer and/or distribute the computer programs, program code, instructions, or some combination thereof, over a network. The remote computing system may transfer and/or distribute the computer programs, program code, instructions, or some combination thereof, via a wired interface, an air interface, and/or any other like medium.

The one or more hardware devices, the one or more storage devices, and/or the computer programs, program code, instructions, or some combination thereof, may be specially designed and constructed for the purposes of the example embodiments, or they may be known devices that are altered and/or modified for the purposes of example embodiments.

A hardware device, such as a computer processing device, may run an operating system (OS) and one or more software applications that run on the OS. The computer processing device also may access, store, manipulate, process, and create data in response to execution of the software. For simplicity, one or more example embodiments may be exemplified as one computer processing device; however, one skilled in the art will appreciate that a hardware device may include multiple processing elements and multiple types of processing elements. For example, a hardware device may include multiple processors or a processor and a controller. In addition, other processing configurations are possible, such as parallel processors.

Although described with reference to specific examples and drawings, modifications, additions and substitutions of example embodiments may be variously made according to the description by those of ordinary skill in the art. For example, the described techniques may be performed in an order different with that of the methods described, and/or components such as the described system, architecture, devices, circuit, and the like, may be connected or combined to be different from the above-described methods, or results may be appropriately achieved by other components or equivalents.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 is a schematic cross-sectional view of an exposure apparatus 99 according to some example embodiments of the inventive concepts.

Referring to FIG. 1, the exposure apparatus 99 may be used in (e.g., may implement) an optical lithography process to pattern a resist layer 80 formed on a substrate 70 via light having a particular (or, alternatively, predetermined) wavelength. The exposure apparatus 99 may include a light source 90 configured to emit light of a particular (or, alternatively, predetermined) wavelength and a reticle 95. The reticle 95 may include a photomask 30 configured to perform an expose operation on the resist layer 80 and a pellicle 60 configured to protect the photomask 30.

To form a minute pattern on the resist layer 80, the light source 90 may emit light of a short wavelength spectrum of light. In detail, the light source 90 may emit light of an extreme ultraviolet ray (EUV) wavelength spectrum of light having a wavelength of approximately 13.3 nm.

Light of the EUV wavelength spectrum of light emitted from the light source 90 enters a reticle 95. The reticle 95 denotes a structure in which the photomask 30 and the pellicle 60 are combined. Although not shown, an optical system, such as a collimating lens may further be arranged on an optical path between the light source 90 and the reticle 95 so that light of the EUV wavelength spectrum of light emitted from the light source 90 becomes uniformly incident onto the reticle 95.

The photomask 30 may be configured to perform an expose operation on the resist layer 80 formed on the substrate 70 by using light of the EUV wavelength spectrum of light emitted from the light source 90. The photomask 30 may include a mask substrate 20 and mask patterns 10 arranged on a surface of the mask substrate 20 in a particular (or, alternatively, predetermined) pattern. Also, the pellicle 60 may be formed on a lower side of the mask substrate 20 to cover the mask patterns 10.

The photomask 30 may include a reflection type photomask. In this case, the light of the EUV wavelength spectrum of light emitted from the light source 90 may enter the photomask 30 after passing through the pellicle 60, and light of a EUV wavelength spectrum of light reflected by the photomask 30 may enter the resist layer 80 on the substrate 70 after passing through the pellicle 60. The mask substrate 20 may include a reflective layer that reflects the light of the EUV wavelength spectrum of light, and the mask patterns 10 may include a light absorption pattern configured to absorb the light of the EUV wavelength spectrum of light. Although not shown, an optical system, such as a focusing lens for focusing (e.g., "configured to focus") the light of the EUV wavelength spectrum of light coming out from the reticle 95, may further be arranged on an optical path between the reticle 95 and the resist layer 80.

The pellicle 60 is arranged on a lower side of the photomask 30 and is configured to protect the photomask 30 from absorbing external contaminants, such as dust or resists. For this purpose, the pellicle 60 may include a pellicle membrane 40 arranged at a particular (or, alternatively, predetermined) distance from the photomask 30, such that an intervening space 44 is at least partially defined by the pellicle 60 and the photomask 30 and is between the pellicle membrane 40 and the photomask 30. The pellicle membrane 40 may be spaced by approximately a few mm from the photomask 30. For example, a distance between the pellicle membrane 40 and the photomask 30 may be in a range from about 1 mm to about 10 mm.

A frame 50 may be arranged between the pellicle membrane 40 and the photomask 30. The frame 50 is arranged on an edge region of the photomask 30 and may support the pellicle membrane 40 to be spaced apart from the photomask 30 by a certain distance. For example, the frame 50 may have a height in a range from about 1 mm to about 10 mm so that the distance between the pellicle membrane 40 and the photomask 30 is in a range from about 1 mm to about 10 mm. A layer that constitutes the frame 50 will be described below.

In the exposure apparatus 99 having a structure described above, an exposure process is performed (e.g., the exposure apparatus 99 is configured to implement an exposure process) such that the light of the EUV wavelength spectrum of light emitted from the light source 90 enters the photomask 30 after passing through the pellicle membrane 40, and light of a EUV wavelength spectrum of light reflected by the photomask 30 enters the resist layer 80 formed on the substrate 70 after passing through the pellicle membrane 40.

In the exposure apparatus 99 of FIG. 1, as an example, the photomask 30 is depicted as a reflection photomask, the example embodiments are not limited thereto, that is, the photomask 30 may be a transmission type photomask. In this case, the mask substrate 20 may include a transmission layer configured to transmit incident light, and the mask pattern 10 may include an absorption pattern configured to absorb incident light.

The pellicle 60 as illustrated in FIG. 1 may be any of the pellicles described herein and any of the pellicles illustrated in any of the figures described herein. Restated, an exposure apparatus 99 according to some example embodiments may include a reticle 95 that includes a pellicle 60 that is any of the pellicles described herein and any of the pellicles illustrated in any of the figures described herein.

Figure 2:
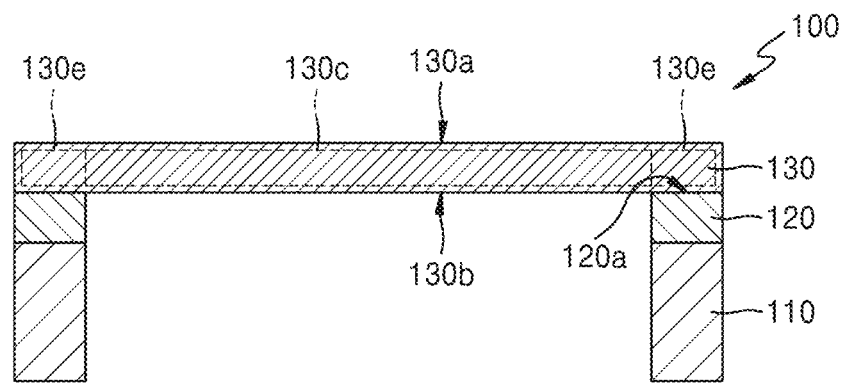
FIG. 2 is a cross-sectional view of a pellicle for a photomask, according to some example embodiments of the inventive concepts.

FIG. 2 is a cross-sectional view of a pellicle 100 for a photomask, according to some example embodiments of the inventive concepts.

Referring to FIG. 2, the pellicle 100 may perform the same function ("a common function") as the pellicle 60 including the pellicle membrane 40 and the frame 50 of FIG. 1. The pellicle 100 may be arranged on a mask substrate to cover a mask pattern of a photomask.

The pellicle 100 includes a substrate 110, a metal catalyst layer 120 on the substrate 110, and a pellicle membrane 130. The metal catalyst layer 120 is formed on the substrate 110. The metal catalyst layer 120 on the substrate 110 may support one or more edge regions 130e of the pellicle membrane 130. In other words, the metal catalyst layer 120 and the substrate 110 may not be formed at a central region 130c of the pellicle membrane 130 that is, only the one or more edge regions 130e of the pellicle membrane 130 may be collectively supported by the metal catalyst layer 120 and the substrate 110. The substrate 110 and the metal catalyst layer 120 formed in this way may perform in the same way as the frame 50 of FIG. 1, and when a reticle (e.g., reticle 95) is formed, may surround the mask patterns 10 in combination with the photomask 30 to at least partially define an intervening space (e.g., intervening space 44). As described herein, a "central region" of a pellicle membrane may be referred to interchangeably as a "central portion" of the pellicle membrane, and an "edge region" of a pellicle membrane may be referred to interchangeably as an "edge portion" of the pellicle membrane. In some example embodiments, an edge region 130e of the pellicle membrane 130 may at least partially surround the central region 130c of the pellicle membrane 130. For example, as shown in FIG. 2, an edge region 130e of the pellicle membrane 130 may at least partially and/or completely surround the central region 130c of the pellicle membrane 130.

Restated, the pellicle membrane 130 on the metal catalyst layer 120 may include a two-dimensional (2D) material, the pellicle membrane may have a central region 130c and an edge region 130e, the edge region 130e at least partially surrounding the central region 130c, and the substrate 110 and the metal catalyst layer 120 may collectively support the edge region 130e of the pellicle membrane 130 and may not support the central region 130c of the pellicle membrane 130.

A sum of a height of the substrate 110 and a height of the metal catalyst layer 120 may be in a range from about 1 mm to about 10 mm so that the pellicle membrane 130 and the photomask may be separated from each other by a particular (or, alternatively, predetermined) distance.

The metal catalyst layer 120 arranged on the substrate 110 may include at least one of Pt, Cu, Ni, Co, Ag, W, Mo, Pd, and Ru. The metal catalyst layer 120 may have a thickness of about 100 μm or less, for example, a thickness greater than about 10 nm and less than about 100 μm. In another example, the metal catalyst layer 120 may have a thickness greater than about 10 nm and less than about 10 μm.

The pellicle membrane 130 may be formed by ("based on") directly growing a material on a surface 120a of the metal catalyst layer 120 (e.g., growing a material directly on a surface 120a of the metal catalyst layer 120). The pellicle membrane 130 may include a material having a two-dimensional (2D) type crystal structure, that is, a 2D material. For example, the pellicle membrane 130 may include a 2D material that includes at least one of h-BN (hexagonal boron nitride), silicon (Si), phosphorus (P), boron (B), and graphene. The pellicle membrane 130 may have a thickness in a range from about 5 n to about 50 nm.

The pellicle membrane 130 may have a high physicochemical durability and a high optical transmittance. For example, the pellicle membrane 130 may have an optical transmittance of greater than or equal to about 80%.

A protection film may be formed on at least one surface of both ("opposite") surfaces 130a, 130b of the pellicle membrane 130. The one or more protection films may reinforce the durability of the pellicle membrane 130 and may reduce and/or minimize deformation of the pellicle membrane 130 that may occur due to accumulation of heat in an exposing process in which light of a EUV wavelength spectrum of light is used. Also, the one or more protection films may provide a high physicochemical durability to the pellicle membrane 130 so as not to be damaged by exposure to light of a EUV wavelength spectrum of light for more than a certain period of time or by a surface cleaning process.

The one or more protection films may include at least one of a carbon-based material, a transition metal dichalcogenide (TMD), Ru, Mo, Si, Zr, B, and SiN. The carbon-based material may include, for example, at least one of amorphous carbon, graphene, nano graphite, carbon nanosheet, carbon nanotube, SiC, and B4C. The TMD may include one of metal element, for example, Mo, W, Nb, V, Ta, Ti, Zr, Hf, Tc, Re, Cu, Ga, In, Sn, Ge, and Pb and one of a chalcogen element, for example, S, Se, and Te.

The pellicle membrane 130 and one or more edge regions of the protection films formed on both surfaces of the pellicle membrane 130 may be supported by the metal catalyst layer 120 and the substrate 110, such that the metal catalyst layer 120 and the substrate 110 collectively support at least one edge region 130e of the pellicle membrane 130 and do not support the central region 130c of the pellicle membrane 130. In other words, the metal catalyst layer 120 and the substrate 110 may perform the same function as the frame 50 of FIG. 1.

FIGS. 3A through 3D are cross-sectional views for explaining a method of manufacturing a pellicle for a photomask according to some example embodiments of the inventive concepts.

Figure 3A:
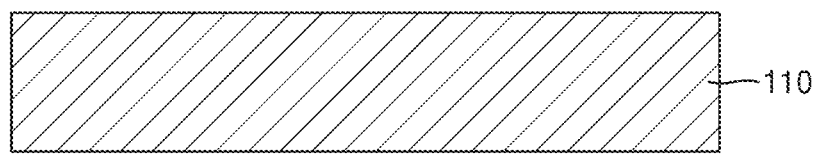
FIG. 3A, FIG. 3B, FIG. 3C, and FIG. 3D are cross-sectional views for explaining a method of manufacturing a pellicle for a photomask, according to some example embodiments of the inventive concepts.
Figure 3B:
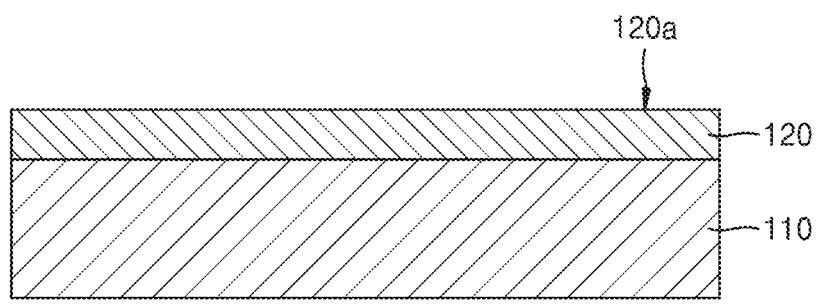

Referring to FIGS. 3A and 3B, the metal catalyst layer 120 is formed on the substrate 110. The substrate 110 may include a material, such as Si, glass, quartz, or $Al_2O_3$. The metal catalyst layer 120 may include at least one of Pt, Cu, Ni, Co, Ag, W, Mo, Pd, and Ru. The metal catalyst layer 120 may have a thickness of 100 µm or less, for example, a thickness greater than 10 nm and less than 10 µm.

Figure 3C:
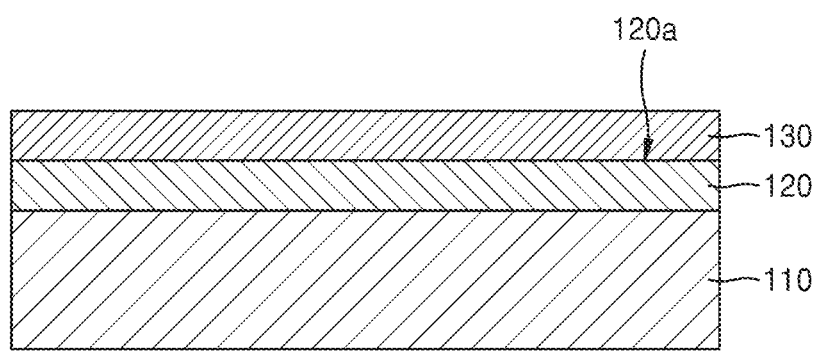

Referring to FIG. 3C, the pellicle membrane 130 including a two-dimensional (2D) material is formed on a surface 120a of the metal catalyst layer 120. As shown in FIG. 3C, the pellicle membrane 130 may be formed directly on a surface 120a of the metal catalyst layer 120. As described herein, in some example embodiments the pellicle membrane 130 may be formed indirectly (e.g., not directly) on the metal catalyst layer 120, such that there is an intervening layer (e.g., a protection layer 150 as described below) between the metal catalyst layer 120 and the pellicle membrane 130 formed thereon. When the pellicle membrane 130 is formed directly on a surface of a material layer, for example, the surface 120a of the metal catalyst layer 120, the pellicle membrane 130 may directly be grown on the surface 120a of the metal catalyst layer 120. The pellicle membrane 130 may include a material having a two-dimensional type crystal structure, that is, a 2D material. For example, the pellicle membrane 130 may include at least one of h-BN, Si, P, B, and graphene. Also, the pellicle membrane 130 may have a thickness in a range from about 5 nm to about 50 nm.

The pellicle membrane 130 may be formed by using a chemical vapor deposition (CVD) method or a physical vapor deposition (PVD) method.

Figure 3D:
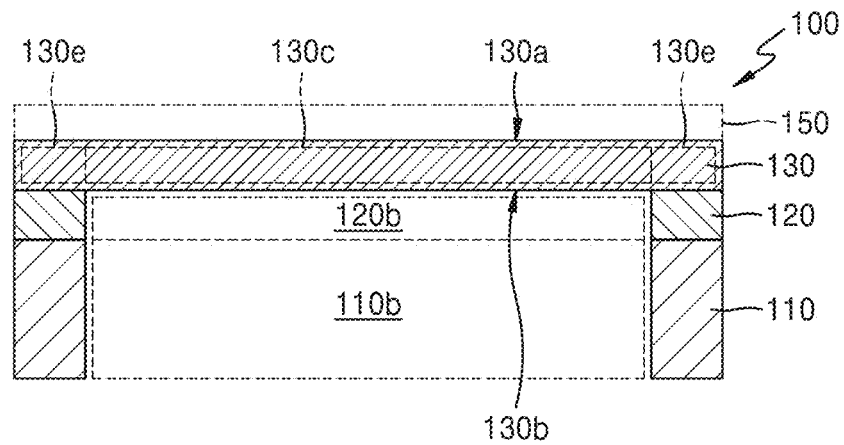

Also, in FIG. 3C, a protection film (not shown) may be formed on the surface 120a of the metal catalyst layer 120 before forming the pellicle membrane 130 on the metal catalyst layer 120. After forming the protection film, the pellicle membrane 130 may be formed on the protection film, and again a protection film (e.g., protection film 150 as shown in FIG. 3D) may be formed on a surface 130a of the pellicle membrane 130. That is, the protection films may be formed on both surfaces 130a, 130b of the pellicle membrane 130, and/or protection film 150 may be formed between pellicle membrane 130 and metal catalyst layer 120 in FIG. 3C, in addition or in alternative to the protection film 150 illustrated on surface 130a of the pellicle membrane 130 in FIG. 3D. However, the example embodiments are not limited thereto, that is, the protection film may be formed only on a surface (e.g., 130a and/or 130b) of the pellicle membrane 130. In this way, when a protection film is formed on at least one surface of the pellicle membrane 130, the protection film may have a surface roughness similar to that of the pellicle membrane 130.

Referring to FIG. 3D, at least inner regions 110b and 120b of the substrate 110 and the metal catalyst layer 120, respectively, that support a central region 130c of the pellicle membrane 130 are etched (e.g., selectively removed), such that the remainder regions of the substrate 110 and the metal catalyst layer 120 collectively support the one or more edge regions 130e of the pellicle membrane 130 and do not support the central region 130c of the pellicle membrane 130. Thus, the one or more edge regions 130e of the pellicle membrane 130 may be understood to be supported by the metal catalyst layer 120 and the substrate 110, and the central region 130c of the pellicle membrane 130 may be understood to be unsupported by the metal catalyst layer 120 and the substrate 110. As shown in FIG. 3D, the remainder regions of the substrate 110 and the metal catalyst layer 120 that collectively support the one or more edge regions 130e of the pellicle membrane 130 and do not support the central region 130c of the pellicle membrane 130 may simply be referred to as the substrate 110 and the metal catalyst layer 120. The substrate 110 and the metal catalyst layer 120 may be etched based on using at least one of a mechanical etching method, a dry etching method, and a wet etching method.

Through the etching process, the substrate 110 and the metal catalyst layer 120 may perform as a frame that supports one or more edge regions 130e of the pellicle membrane 130 and does not support central region 130c of the pellicle membrane 130. As referred to herein, and as shown in at least FIG. 3D, a layer that is described as "not" supporting the central region of a pellicle membrane will be understood to be directly supporting the one or more edge regions of the pellicle membrane and indirectly supporting the central region of the pellicle membrane through the one or more edge regions of the pellicle membrane while not directly supporting the central region of the pellicle membrane. For example, as shown in FIG. 3D, the metal catalyst layer 120 and the substrate 110 will be understood to collectively "directly" support the one or more edge regions 130e of the pellicle membrane 130 and collectively do not "directly" support the central region 130c of the pellicle membrane 130 but instead "indirectly" support the central region 130c through the one or more edge regions 130e, and thus will be understood to collectively support the one or more edge regions 130e of the pellicle membrane 130 and to not support the central region 130c of the pellicle membrane 130.

Figure 4:
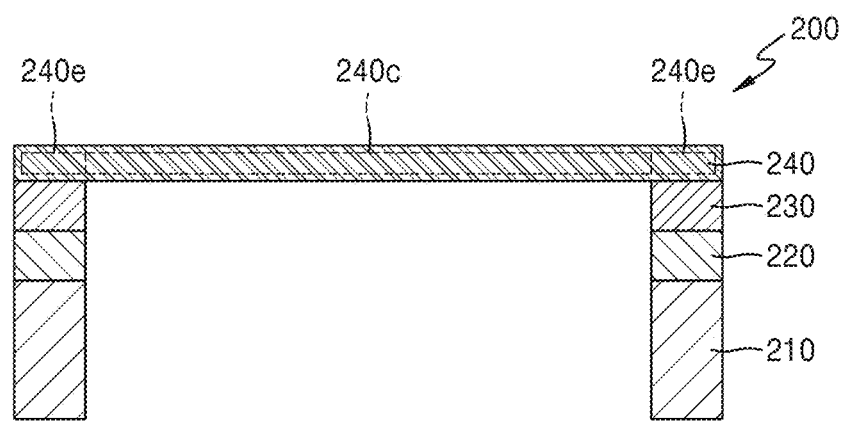
FIG. 4 is a cross-sectional view of a pellicle for a photomask, according to some example embodiments of the inventive concepts.

FIG. 4 is a cross-sectional view of a pellicle 200 for a photomask, according to some example embodiments of the inventive concepts.

Referring to FIG. 4, the pellicle 200 may perform the same function as the pellicle 60 that includes the pellicle membrane 40 and the frame 50.

The pellicle 200 includes a substrate 210, a barrier layer 220 on the substrate 210, a metal catalyst layer 230 on the barrier layer 220, and a pellicle membrane 240. As shown in FIG. 4, the barrier layer 220 may be between the substrate 210 and the metal catalyst layer 230. The substrate 210, the barrier layer 220, and the metal catalyst layer 230 may support only one or more edge regions 240e of the pellicle membrane 240 and not a central region 240c of the pellicle membrane 240 (e.g., only indirectly support the central region 240c via the one or more edge regions 240e).

The barrier layer 220 formed on the substrate 210 may solidly bond the metal catalyst layer 230 to the substrate 210. Through this, durability of the pellicle 200 may be increased. The barrier layer 220 may include at least one of $SiO_2$, $Si_3N_4$, TiN, and TaN.

The metal catalyst layer 230 formed on the barrier layer 220 may include at least one of Pt, Cu, Ni, Co, Ag, W, Mo, Pd, and Ru.

The structure and materials of the substrate 210, the metal catalyst layer 230, and the pellicle membrane 240 except the barrier layer 220 are the same as the structure and materials described with reference to FIG. 2, and thus, the descriptions thereof will be omitted.

FIGS. 5A through 5E are cross-sectional views for explaining a method of manufacturing a pellicle for a photomask, according to some example embodiments of the inventive concepts.

Figure 5A:
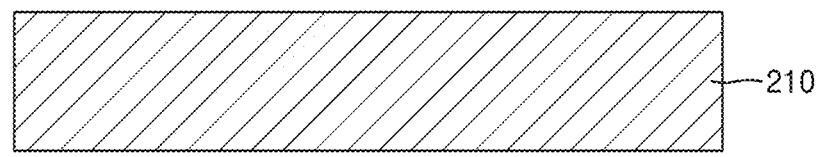
FIG. 5A, FIG. 5B, FIG. 5C, FIG. 5D, and FIG. 5E are cross-sectional views for explaining a method of manufacturing a pellicle for a photomask, according to some example embodiments of the inventive concepts.
Figure 5B:
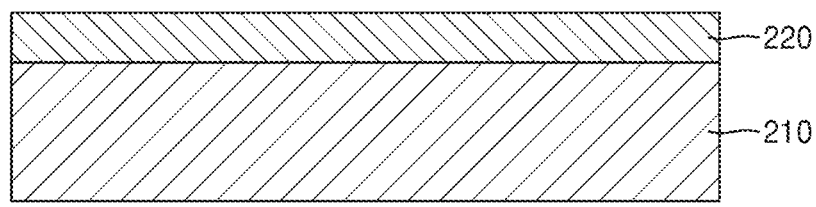

Referring to FIGS. 5A and 5B, the barrier layer 220 is formed on the substrate 210. The substrate 210 may include a material, such as Si, glass, quartz, or $Al_2O_3$. The barrier layer 220 may include at least one of $SiO_2$, $Si_3N_4$, TiN, and TaN.

Figure 5C:
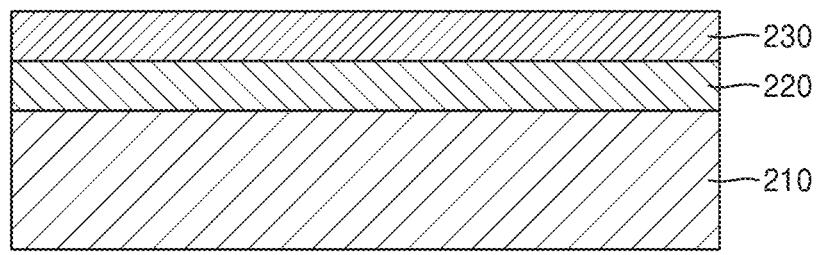

Referring to FIG. 5C, the metal catalyst layer 230 is formed on the barrier layer 220. The metal catalyst layer 230 may include at least one of Pt, Cu, Ni, Co, Ag, W, Mo, Pd, and Ru.

Figure 5D:
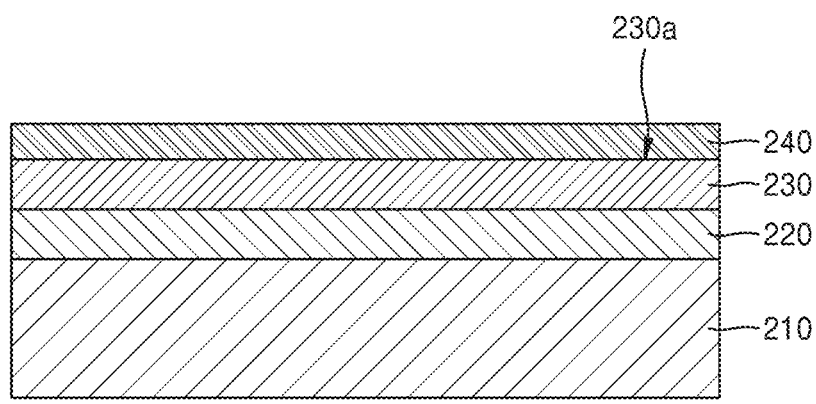

Referring to FIG. 5D, the pellicle membrane 240 including a 2D material is (directly or indirectly) formed on a surface 230a of the metal catalyst layer 230. The pellicle membrane 240 may be formed by using a CVD method or a PVD method.

Figure 5E:
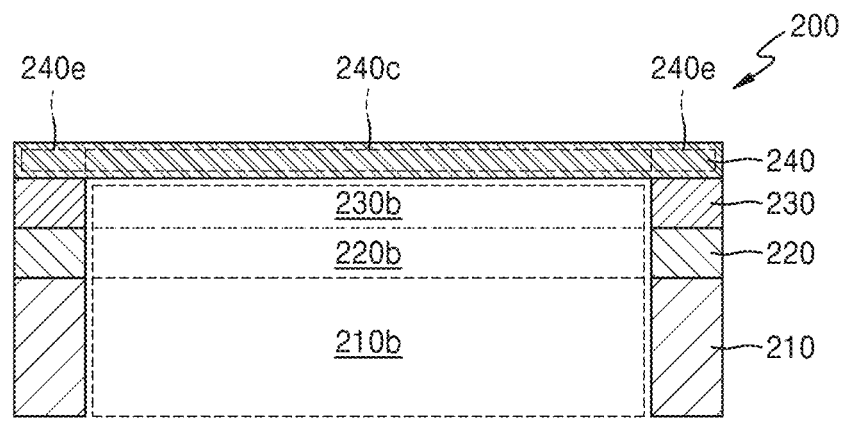

Referring to FIG. 5E, at least inner regions 210b, 220b, 230b of the substrate 210, the barrier layer 220, and the metal catalyst layer 230 that support a central region 240c of the pellicle membrane 240, respectively are etched. The substrate 210, the barrier layer 220, and the metal catalyst layer 230 may be etched based on using at least one of a mechanical etching method, a dry etching method, and a wet etching method.

Through the etching process, and as shown in FIG. 5E, the remainder regions of the substrate 210, the barrier layer 220, and the metal catalyst layer 230 may perform as a frame that ("directly") supports one or more edge regions 240e of the pellicle membrane 240 and does not ("directly") support central region 240c of the pellicle membrane 240.

Figure 6:
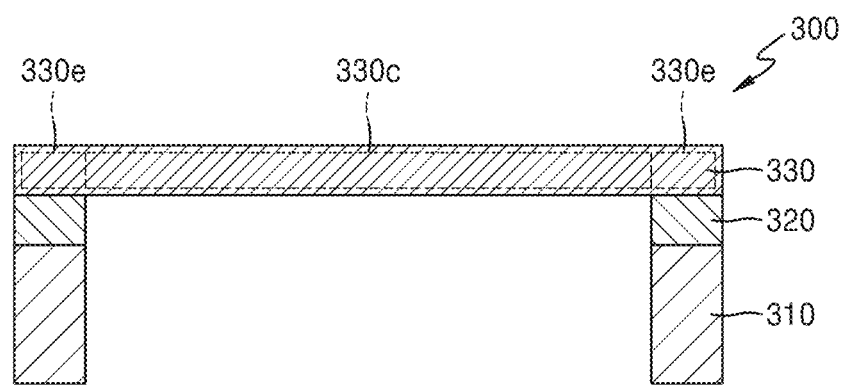
FIG. 6 is a cross-sectional view of a pellicle for a photomask, according to some example embodiments of the inventive concepts.

FIG. 6 is a cross-sectional view of a pellicle 300 for a photomask, according to some example embodiments of the inventive concepts.

Referring to FIG. 6, the pellicle 300 may perform the same function as the pellicle 60 including the pellicle membrane 40 and the frame 50 of FIG. 1.

The pellicle 300 includes a substrate 310, a barrier layer 320 on the substrate 310, and a pellicle membrane 330. The substrate 310 and the barrier layer 320 may perform as the frame 50 of FIG. 1, that is, the substrate 310 and the barrier layer 320 support one or more edge regions 330e of the pellicle membrane 330.

FIGS. 7A through 7F are cross-sectional views for explaining a method of manufacturing a pellicle for a photomask, according to some example embodiments of the inventive concepts.

Figure 7A:
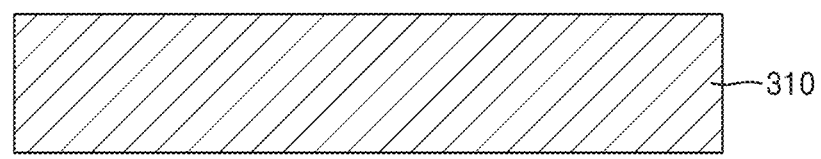
FIG. 7A, FIG. 7B, FIG. 7C, FIG. 7D, FIG. 7E, and FIG. 7F are cross-sectional views for explaining a method of manufacturing a pellicle for a photomask, according to some example embodiments of the inventive concepts.
Figure 7B:
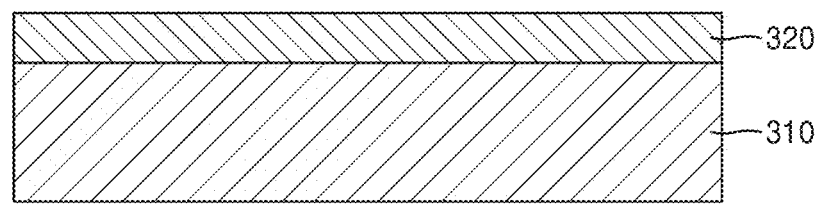

Referring to FIGS. 7A and 7B, the barrier layer 320 is formed on the substrate 310. The substrate 310 may include Si, glass, quartz, or $Al_2O_3$. The barrier layer 320 may include at least one of $SiO_2$, $Si_3N_4$, TiN, and TaN.

Figure 7C:
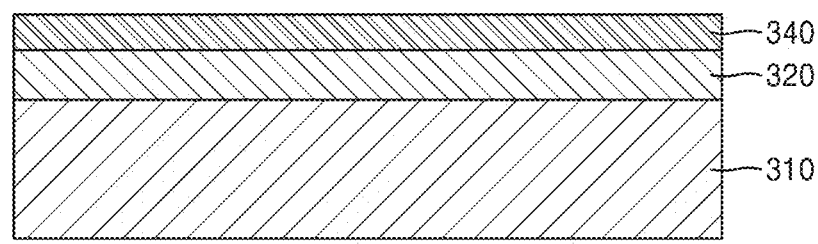

Referring to FIG. 7C, a metal catalyst layer 340 is formed on the barrier layer 320. The metal catalyst layer 340 may include at least one of Pt, Cu, Ni, Co, Ag, W, Mo, Pd, and Ru.

Figure 7D:
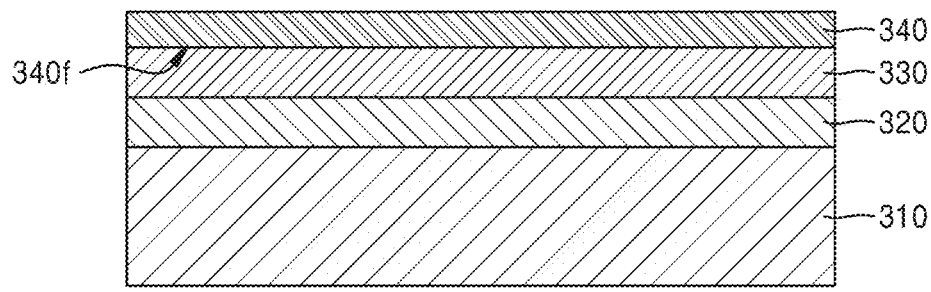

Referring to FIG. 7D, the pellicle membrane 330 including a 2D material is (directly or indirectly) formed on a lower side (e.g., lower surface 340f) of the metal catalyst layer 340 (e.g., between the metal catalyst layer 340 and the barrier layer 320). The pellicle membrane 330 may include a material having a two-dimensional (2D) type crystal structure, that is, a 2D material. For example, the pellicle membrane 330 may include at least one of h-BN, Si, P, B, and graphene. When a 2D material for forming the pellicle membrane 330 is deposited on the metal catalyst layer 340 by using a CVD method or a PVD method, the 2D material may penetrate into the metal catalyst layer 340. At this point, through a control of a material that constitutes the barrier layer 320 and a control of process temperature and pressure, the pellicle membrane 330 including a 2D material may be formed on a lower side of the metal catalyst layer 340.

Figure 7E:
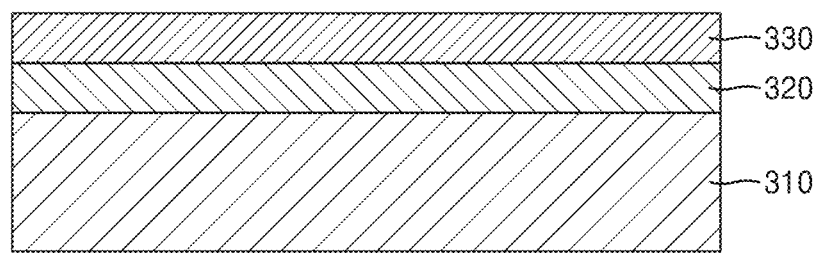

Referring to FIG. 7E, the metal catalyst layer 340 is removed. To remove the metal catalyst layer 340, at least one of a mechanical etching method, a dry etching method, and a wet etching method may be used. Restated, the metal catalyst layer 340 may be removed based on using at least one of a mechanical etching method, a dry etching method, and a wet etching method.

Figure 7F:
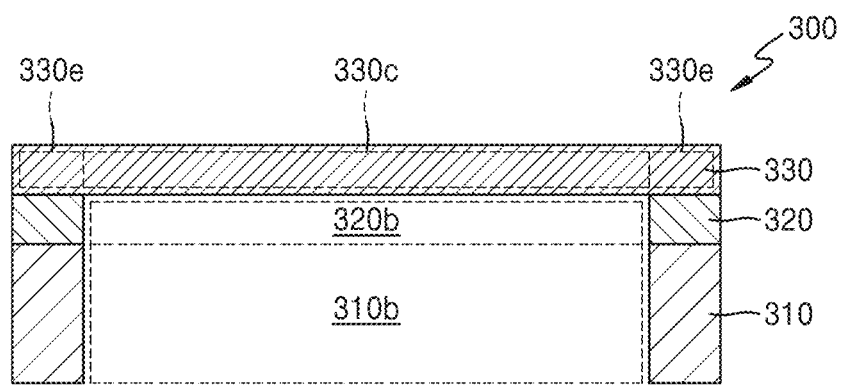

Referring to FIG. 7F, at least inner regions 310b, 320b of the substrate 310 and the barrier layer 320, respectively, that support a central region 330c of the pellicle membrane 330 are etched. The substrate 310 and the barrier layer 320 may be etched based on using at least one of a mechanical etching method, a dry etching method, and a wet etching method.

Through the above etching process, the substrate 310 and the barrier layer 320 may ("directly") support one or more edge regions 330e of the pellicle membrane 330 and may not ("directly") support central region 330c of the pellicle membrane.

Figure 8A:
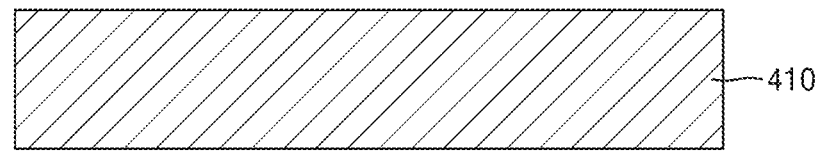
FIG. 8A, FIG. 8B, and FIG. 8C are cross-sectional views for explaining a method of manufacturing a pellicle for a photomask, according to some example embodiments of the inventive concepts.
Figure 8B:
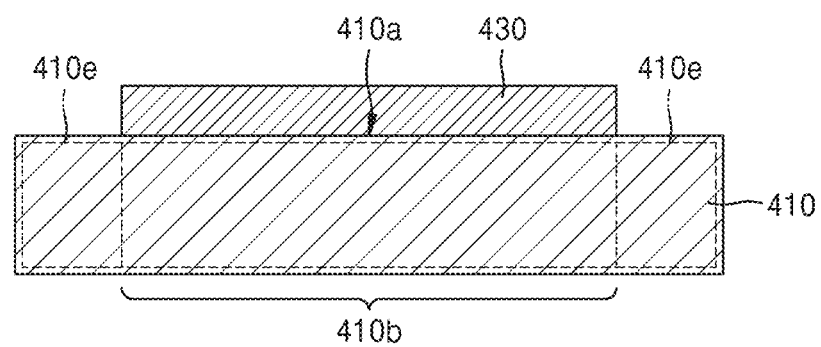
Figure 8C:
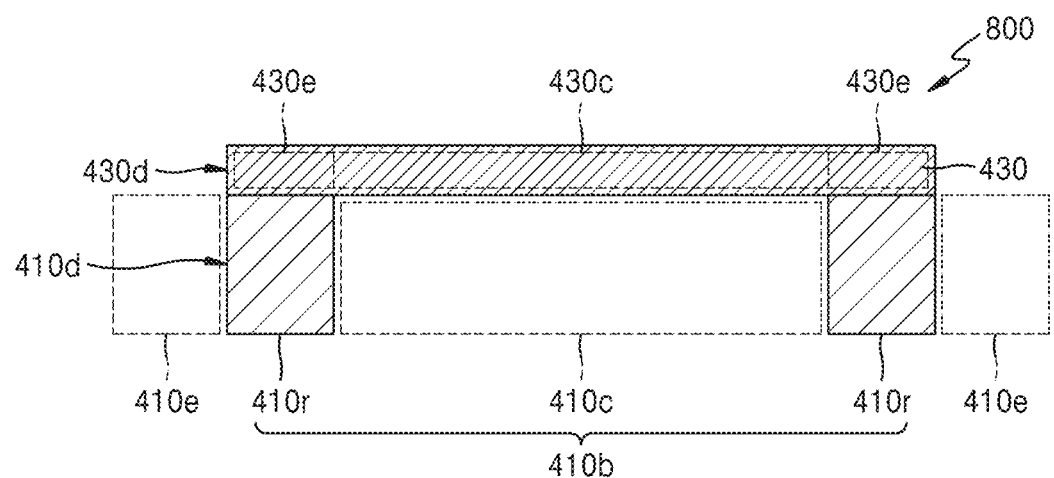

FIGS. 8A through 8C are cross-sectional views for explaining a method of manufacturing a pellicle for a photomask according to some example embodiments of the inventive concepts.

In some example embodiments, the metal catalyst layer may perform as a substrate (or, restated, the substrate may perform as the metal catalyst layer), such that the substrate as an element separate from the metal catalyst layer is omitted from the pellicle.

Referring to FIG. 8A, a substrate 410 that is configured to perform as a metal catalyst layer is provided. The substrate 410 may include a material, including at least one of Pt, Cu, Ni, Co, Ag, W, Mo, Pd, and Ru. In some example embodiments, the substrate 410 may have a thickness of 100 µm or less, for example, a thickness greater than 10 nm and less than 10 µm. Accordingly, the substrate 410 may be referred to interchangeably herein as a "metal catalyst layer" having some or all of the properties and/or characteristics of the metal catalyst layers described herein.

Referring to FIG. 8B, the pellicle membrane 430 including a two-dimensional (2D) material is directly formed on a surface 410a of the substrate 410. The pellicle membrane 430 may include a material having a two-dimensional type crystal structure, that is, a 2D material. For example, the pellicle membrane 430 may include at least one of h-BN, Si, P, B, and graphene. Also, the pellicle membrane 430 may have a thickness in a range from about 5 nm to about 50 nm.

The pellicle membrane 430 may be formed by using a chemical vapor deposition (CVD) method or a physical vapor deposition (PVD) method.

Also, in FIG. 8B, a protection film (not shown) may be formed on the surface 410a of the substrate 410 before forming the pellicle membrane 430 on the substrate 410. After forming the protection film, the pellicle membrane 430 may be formed on the protection film, and again a protection film may be formed on a substrate-distal surface of the pellicle membrane 430. That is, the protection films may be formed on opposite surfaces of the pellicle membrane 430. However, the example embodiments are not limited thereto, that is, the protection film may be formed only on an individual surface of the pellicle membrane 430. In this way, when a protection film is formed on at least one surface of the pellicle membrane 430, the protection film may have a surface roughness similar to that of the pellicle membrane 430.

As shown in FIG. 8B, the pellicle membrane 430 may be formed on a limited region 410b of the surface 410a of the substrate 410, such that an edge region 410e of the substrate 410 is exposed by the pellicle membrane 430. The pellicle membrane 430 may be formed to have a particular (or, alternatively, predetermined) shape and/or size on the limited region 410b of the substrate 410.

Referring to FIG. 8C, at least an inner region 410c of the limited region 410b of the substrate 410 that supports a central region 430c of the pellicle membrane 430 is etched (e.g., selectively removed), thereby leaving a remainder region 410r of the limited region 410b of the substrate 410. In addition, as further shown in FIG. 8C, the one or more edge regions 410e of the substrate 410 that are exposed by the pellicle membrane 430 may be etched, so that outer side surfaces 430d and 410d of the pellicle membrane 430 and the substrate 410 are flush or substantially flush (e.g., flush within manufacturing tolerances and/or material tolerances). The substrate 410 may be etched based on using at least one of a mechanical etching method, a dry etching method, and a wet etching method.

Through the etching process, the remainder region 410r of the substrate 410 may perform as a frame that ("directly") supports one or more edge regions 430e of the pellicle membrane 430 and does not ("directly") support central region 430c of the pellicle membrane 430 (e.g., indirectly supports the central region 430c via the one or more edge regions 430e). Thus, as shown in FIG. 8C, a pellicle 800 that includes the pellicle membrane 430 and the remainder region 410r of the substrate 410 may be formed.

In the methods of manufacturing a pellicle for a photomask according to some example embodiments of the inventive concepts, a pellicle membrane is not formed by a conventional transfer method. In the methods described above, a pellicle membrane is directly formed on a material layer using a growth method.

For example, when the pellicle membrane is the pellicle membrane 130 of FIG. 3C and the material layer is the metal catalyst layer 120 and when the pellicle membrane 130 is formed by a conventional transfer method and when the pellicle membrane 130 is directly formed by a growth method, there is difference of an adhesive power between the pellicle membrane 130 and the metal catalyst layer 120.

According to an experimental example, an adhesive power between the pellicle membrane 130 and the metal catalyst layer 120 was about 180 MPa when the pellicle membrane 130 is formed on the metal catalyst layer 120 using a conventional transfer method.

On the other hand, the adhesive power between the pellicle membrane 130 and the metal catalyst layer 120 was about 1200 MPa when the pellicle membrane 130 is directly formed on the metal catalyst layer 120 using a growth method.

The experimental result indicates that the adhesive power between the pellicle membrane 130 and the metal catalyst layer 120 when the pellicle membrane 130 is directly formed on the metal catalyst layer 120 using a growth method is largely increased than when the pellicle membrane 130 is formed on the metal catalyst layer 120 using a conventional transfer method.

In the experimental example, a silicone substrate was used as the substrate 110, an Ni—Cu alloy was used as the metal catalyst layer 120 and graphene having thickness less than 100 nm was used as the pellicle membrane 130. Also, a PMMA supported wet transfer method was used as the conventional transfer method and a CVD method was used as the growth method.

According to the inventive concepts, a pellicle membrane that protects a photomask from external contaminants may have high physicochemical durability without being damaged by exposure to light of a EUV wavelength spectrum of light for more than a certain period of time or by a surface cleaning process.

Also, since a pellicle membrane is formed by selectively removing a metal catalyst layer after directly growing a 2D material on the metal catalyst layer, the pellicle membrane may be formed without using a transfer process (e.g., without transferring the pellicle membrane onto the metal catalyst layer).

Also, the metal catalyst layer and the substrate, central regions thereof are selectively removed may be used as a frame for supporting the pellicle membrane.

Durability of the pellicle membrane may further be increased and deformation of the pellicle membrane that may cause due to heat accumulation may be reduced and/or minimized by forming a protection film on at least a surface of the pellicle membrane, and thus, a lifetime of the pellicle may be increased.

The example embodiments are examples, and thus, it will be understood by those of ordinary skill in the art that various changes in form and details may be made therein without departing from the spirit and scope of the inventive concepts. Therefore, the embodiments should be considered in descriptive sense only and not for purposes of limitation. For example, each constituent element that is described as a singular form may be embodied in distribution forms. Also, constituent elements that are described in distribution forms may be embodied in a combined form.

Therefore, the scopes of the embodiments are defined not by the detailed description but by the appended claims, and all differences within the scope will be construed as being included in the example embodiments.

What is claimed is:

1. A pellicle configured to protect a photomask, the pellicle comprising:
   a substrate;
   a metal catalyst layer on the substrate;
   a barrier layer only between the substrate and the metal catalyst layer; and
   a pellicle membrane on the metal catalyst layer, the pellicle membrane including a two-dimensional (2D) material, the pellicle membrane having a central region and an edge region, the edge region at least partially surrounding the central region,
   wherein the substrate and the metal catalyst layer collectively support the edge region of the pellicle membrane and do not support the central region of the pellicle membrane.

2. The pellicle of claim 1, wherein the barrier layer is only between an upper surface of the substrate and a bottom surface of the metal catalyst layer.

3. The pellicle of claim 2, wherein the barrier layer is in direct contact with an entire upper surface of the substrate and an entire bottom surface of the metal catalyst layer.

4. The pellicle of claim 1, wherein the metal catalyst layer has a thickness in a range from about 10 nm to about 100 μm.

5. The pellicle of claim 1, wherein the metal catalyst layer has a thickness in a range from about 10 nm to about 10 μm.

6. The pellicle of claim 1, wherein the barrier layer includes at least one of SiO2, Si3N4, TiN, and TaN.

7. The pellicle of claim 1, wherein the 2D material includes at least one of h-BN, Si, P, B, and graphene.

8. The pellicle of claim 7, wherein the pellicle membrane has a thickness in a range from about 5 nm to about 50 nm.

9. The pellicle of claim 1, wherein the metal catalyst layer includes at least one of Pt, Cu, Ni, Co, Ag, W, Mo, Pd, and Ru.

10. The pellicle of claim 1, wherein the pellicle membrane has an optical transmittance greater than or equal to about 80%.

11. The pellicle of claim 1, wherein a sum of a height of the metal catalyst layer and a height of the substrate is in a range from about 1 mm to about 10 mm.

12. The pellicle of claim 1, further comprising:
    a protection film on at least one surface of the pellicle membrane.

13. The pellicle of claim 12, wherein the protection film includes at least one of a carbon-based material, a transition metal dichalcogenide (TMD), Ru, Mo, Si, Zr, B, and SiN.

14. A method of manufacturing a pellicle configured to protect a photomask, the method comprising:
    forming a barrier layer on a substrate;
    forming a metal catalyst layer on the substrate such that the barrier layer is only between the substrate and the metal catalyst layer;
    forming a pellicle membrane on the metal catalyst layer, the pellicle membrane including a two-dimensional (2D) material, the pellicle membrane including a central region and an edge region, the edge region at least partially surrounding the central region; and
    etching at least inner regions of the substrate and the metal catalyst layer that support the central region of the pellicle membrane, such that the substrate and the metal catalyst layer collectively support the edge region of the pellicle membrane and do not support the central region of the pellicle membrane.

15. The method of claim 14, wherein the barrier layer is only between an upper surface of the substrate and a bottom surface of the metal catalyst layer.

16. The method of claim 15, wherein the barrier layer is in direct contact with an entire upper surface of the substrate and an entire bottom surface of the metal catalyst layer.

17. The method of claim 14, further comprising:
    forming a protection film on at least one surface of the pellicle membrane.

18. The method of claim 14, wherein the forming of the pellicle membrane includes forming the pellicle membrane directly on a surface of the metal catalyst layer.

19. The method of claim 14, wherein the etching includes etching the substrate and the metal catalyst layer based on using at least one of a mechanical etching method, a dry etching method, and a wet etching method.

20. A reticle, comprising:
    a photomask including a mask pattern; and
    a pellicle including
    a substrate,
    a metal catalyst layer on the substrate and surrounding the mask pattern,
    a barrier layer only between the substrate and the metal catalyst layer, and
    a pellicle membrane including a two-dimensional (2D) material, the pellicle membrane including a central region and an edge region, the edge region at least partially surrounding the central region, the edge region supported by the substrate and the metal catalyst layer, the central region unsupported by the substrate and the metal catalyst layer.

21. The reticle of claim 20, wherein the photomask is spaced apart from the pellicle membrane by a distance in a range from about 1 mm to about 10 mm.

22. The reticle of claim 20, wherein the metal catalyst layer has a thickness in a range from about 10 nm to about 100 μm.

23. The reticle of claim 20, wherein the metal catalyst layer has a thickness in a range from about 10 nm to about 10 μm.

24. The reticle of claim 20, wherein
    the barrier layer is only between an upper surface of the substrate and an bottom surface of the metal catalyst layer, and
    the barrier layer is in direct contact with an entire upper surface of the substrate and an entire bottom surface of the metal catalyst layer.

25. The reticle of claim 20, wherein the barrier layer includes at least one of SiO2, Si3N4, TiN, and TaN.

26. The reticle of claim 20, wherein the 2D material includes at least one of h-BN, Si, P, B, and graphene.

27. The reticle of claim 26, wherein the pellicle membrane has a thickness in a range from about 5 nm to about 50 nm.

28. The reticle of claim 20, wherein the metal catalyst layer comprises at least one of Pt, Cu, Ni, Co, Ag, W, Mo, Pd, and Ru.

29. The reticle of claim 20, wherein the pellicle membrane has an optical transmittance greater than or equal to about 80%.

30. The reticle of claim 20, wherein the pellicle includes a protection film on at least one surface of the pellicle membrane.

31. The reticle of claim 30, wherein the protection film includes at least one of a carbon-based material, a transition metal dichalcogenide (TMD), Ru, Mo, Si, Zr, B, and SiN.

* * * * *